United States Patent
Su et al.

(10) Patent No.: US 10,204,924 B2
(45) Date of Patent: Feb. 12, 2019

(54) THIN FILM TRANSISTOR, MANUFACTURING METHOD THEREOF, DISPLAY SUBSTRATE AND DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Tongshang Su, Beijing (CN); Bin Zhou, Beijing (CN); Dongfang Wang, Beijing (CN); Guangcai Yuan, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/344,194

(22) Filed: Nov. 4, 2016

(65) Prior Publication Data

US 2017/0200746 A1    Jul. 13, 2017

(30) Foreign Application Priority Data

Jan. 12, 2016   (CN) .......................... 2016 1 0019045

(51) Int. Cl.
*H01L 27/12*        (2006.01)
*H01L 21/027*       (2006.01)
(Continued)

(52) U.S. Cl.
CPC ...... *H01L 27/1225* (2013.01); *H01L 21/0273* (2013.01); *H01L 21/467* (2013.01);
(Continued)

(58) Field of Classification Search
CPC ............. H01L 27/1225; H01L 27/1288; H01L 27/1229; H01L 27/1233
See application file for complete search history.

(56) References Cited

U.S. PATENT DOCUMENTS 8,058,645 B2 * 11/2011 Jeong .................. H01L 27/1225
257/43
8,148,779 B2 * 4/2012 Jeong .................. H01L 29/4908
257/347
(Continued)

FOREIGN PATENT DOCUMENTS

CN         101656270 A    2/2010
CN         101752390 A    6/2010
(Continued)

OTHER PUBLICATIONS

Partial machine translation, Kudo, JP H4-49547, translation date: Mar. 29, 2017, Espacenet, all pages.*
(Continued)

*Primary Examiner* — Victoria K. Hall
(74) *Attorney, Agent, or Firm* — Banner & Witcoff, Ltd.

(57) ABSTRACT

A thin film transistor (TFT), a manufacturing method thereof, a display substrate and a display device are disclosed. The TFT includes: a gate electrode; a gate insulating layer disposed on the gate electrode; a first active layer disposed on the gate insulating layer; a second active layer disposed on the first active layer, having a length smaller than that of the second active layer; a source electrode disposed on the first active layer, being contacted with a first side of the second active layer; and a drain electrode disposed on the first active layer, being contacted with a second side of the second active layer. Embodiments of the present invention can increase an ON-state current and meanwhile reduce an OFF leakage current in the TFT.

11 Claims, 5 Drawing Sheets

(51) Int. Cl.
*H01L 21/467* (2006.01)
*H01L 29/417* (2006.01)
*H01L 29/423* (2006.01)
*H01L 29/66* (2006.01)
*H01L 29/786* (2006.01)

(52) U.S. Cl.
CPC ...... *H01L 27/1229* (2013.01); *H01L 27/1233* (2013.01); *H01L 27/1288* (2013.01); *H01L 29/41733* (2013.01); *H01L 29/42384* (2013.01); *H01L 29/66969* (2013.01); *H01L 29/7869* (2013.01); *H01L 29/78609* (2013.01); *H01L 29/78696* (2013.01)

(56) References Cited

U.S. PATENT DOCUMENTS

| | | | | |
|---|---|---|---|---|
| 9,947,797 | B2* | 4/2018 | Yamazaki | H01L 29/4908 |
| 10,103,212 | B2* | 10/2018 | Jinta | H01L 51/504 |
| 10,134,909 | B2* | 11/2018 | Yamazaki | H01L 29/78693 |
| 10,153,304 | B2* | 12/2018 | Qin | H01L 27/1225 |
| 2003/0194569 | A1* | 10/2003 | Angelopoulos | C23C 14/0676 |
| | | | | 428/432 |
| 2008/0296568 | A1* | 12/2008 | Ryu | H01L 21/02554 |
| | | | | 257/43 |
| 2009/0250693 | A1* | 10/2009 | Jeong | H01L 27/1225 |
| | | | | 257/43 |
| 2009/0261325 | A1* | 10/2009 | Kawamura | H01L 27/1214 |
| | | | | 257/43 |
| 2009/0278120 | A1* | 11/2009 | Lee | H01L 29/7869 |
| | | | | 257/43 |
| 2009/0317950 | A1 | 12/2009 | Okihara | |
| 2010/0025675 | A1* | 2/2010 | Yamazaki | H01L 27/1248 |
| | | | | 257/43 |
| 2010/0044699 | A1* | 2/2010 | Chung | H01L 29/78618 |
| | | | | 257/43 |
| 2010/0065837 | A1* | 3/2010 | Omura | H01L 29/7869 |
| | | | | 257/43 |
| 2010/0140613 | A1 | 6/2010 | Kimura | |
| 2011/0140100 | A1* | 6/2011 | Takata | H01L 29/7869 |
| | | | | 257/43 |
| 2012/0052609 | A1 | 3/2012 | Jeong et al. | |
| 2013/0037806 | A1* | 2/2013 | Hayashi | H01L 29/78669 |
| | | | | 257/57 |
| 2013/0087785 | A1* | 4/2013 | Akimoto | H01L 27/1225 |
| | | | | 257/43 |
| 2013/0280858 | A1* | 10/2013 | Kimura | H01L 27/1225 |
| | | | | 438/104 |
| 2014/0027762 | A1* | 1/2014 | Tsurume | H01L 29/24 |
| | | | | 257/43 |
| 2014/0367673 | A1* | 12/2014 | Takahashi | H01L 29/7869 |
| | | | | 257/43 |
| 2016/0343864 | A1 | 11/2016 | Jiang et al. | |
| 2016/0372498 | A1* | 12/2016 | Ahn | H01L 27/1288 |

FOREIGN PATENT DOCUMENTS

| | | | |
|---|---|---|---|
| CN | 103038887 A | 4/2013 | |
| CN | 104638016 A | 5/2015 | |
| JP | H4-49547 | * 2/1992 | G11B 11/10 |

OTHER PUBLICATIONS

Dec. 29, 2017—(CN) First Office Action Appn 201610019045.2 with English Tran.
Sep. 12, 2018—(CN) Second Office Action Appn 201610019045.2 with English Translation.

* cited by examiner

THIN FILM TRANSISTOR, MANUFACTURING METHOD THEREOF, DISPLAY SUBSTRATE AND DISPLAY DEVICE

This application claims priority to and the benefit of Chinese Patent Application No. 201610019045.2 filed on Jan. 12, 2016, which application is incorporated herein in its entirety.

TECHNICAL FILED

Embodiments of present invention relate to a thin film transistor (TFT), a manufacturing method thereof, a display substrate, and a display device.

BACKGROUND

With the rapid development of thin film transistor (TFT) display technology, display devices tend to be manufactured in increasingly larger dimensions. For larger-scaled display devices, problems such as extended charging duration and even incomplete charging that causes decreased gray level have emerged due to increased rows and columns of gate lines and data lines. As a result, it is required to increase ON-state current in the TFT. On the other hand, however, excessively larger OFF-state current in the TFT may degrade its capability of holding voltage and also increase power consumption, thus it also needs to increase a switch ratio of the TFT and hence to further improve a performance thereof.

SUMMARY

At least one embodiment of the present invention provides a thin film transistor (TFT), a manufacturing method thereof, a display substrate, and a display device, which can increase an ON-state current and meanwhile reduce an OFF leakage current in the TFT.

In order to achieve the objective above, the embodiments of the present invention provide technical solutions as below.

On one aspect, an embodiment of the present invention provides a thin film transistor (TFT), including: a gate electrode; a gate insulating layer disposed on the gate electrode; a first active layer disposed on the gate insulating layer; a second active layer disposed on the first active layer, having a length smaller than that of the first active layer; a source electrode disposed on the first active layer, being contacted with a first side of the second active layer; and a drain electrode disposed on the first active layer, being contacted with a second side of the second active layer.

On another aspect, an embodiment of the present invention provides a manufacturing method of a TFT, including: forming a gate electrode on a substrate; forming a gate insulating layer on the gate electrode; forming a first active layer on the gate insulating layer; forming a second active layer on the first active layer, the second active layer having a length smaller than that of the first active layer; and forming a source electrode and a drain electrode on the first active layer, the source electrode and the drain electrode being contacted with two sides of the second active layer, respectively.

On yet another aspect, an embodiment of the present invention provides a display substrate including the above-mentioned TFT.

On still another aspect, an embodiment of the present invention provides a display device including the above-mentioned display substrate.

BRIEF DESCRIPTION OF THE DRAWINGS

Hereafter, the embodiments of the present invention will be described in detail with reference to the accompanying drawings, so as to make those skilled in the art understand the present invention more clearly, wherein.

DETAILED DESCRIPTION

Hereafter, the technical solutions of the embodiments of the present disclosure will be described in a clear and complete way in connection with the drawings related to the embodiments of the present disclosure. It is obvious that the described embodiments are just a part but not all of the present disclosure. Based on the described embodiments of the present disclosure, those ordinarily skilled in the art can obtain other embodiment(s), without any inventive work, which come(s) within the scope sought for protection by the present disclosure.

Unless otherwise defined, the technical terminology or scientific terminology used herein should have the same meaning as commonly understood by one of ordinary skill in the art to which this invention belongs. Terms used in the present description and claims such as "first", "second" and so on are only used for distinguishing different components, and cannot be construed as indicating or implying sequence, amount and relative importance. Likewise, a term "a," "an," or "the" does not indicate limitation in number, but specifies the presence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
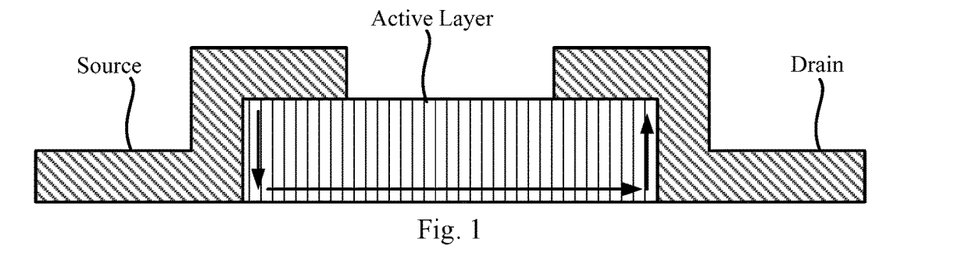
FIG. 1 is a schematic view illustrating a current direction in an active layer of an existing thin film transistor (TFT)

As illustrated in FIG. 1, a current in an active layer of a conducted (ON-state) thin film transistor (TFT) usually flows downwards from a side wall of the active layer contacting with a source electrode, along a bottom side of the active layer, and then upwards from the another side wall of the active layer contacting with a drain electrode. The inventors of the present invention have realized that: the bottom side (i.e., a conductive bottom) of the active layer has a relatively larger resistance (e.g., $10^4\Omega$) while the two side walls have a relatively smaller resistance (e.g., $10\Omega$), thus a gate electrode beneath the active layer in a conducted TFT reduces the resistance of the bottom side of the active layer to approximately zero while the resistance of the two side walls are less affected; that is, the two side walls directly connected with the conductive bottom in the TFT contribute the most to the variation of the ON-resistance.

Figure 2:
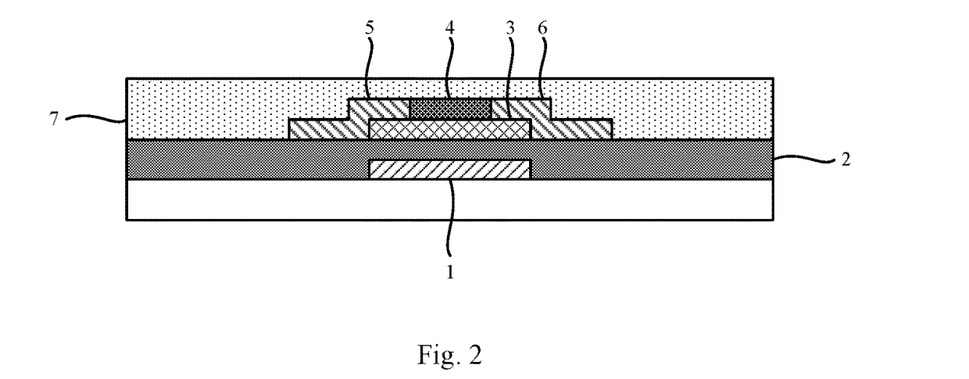
FIG. 2 is a schematically structural view illustrating a TFT provided by an embodiment of the present invention.

The embodiment of the present invention provides a thin film transistor (TFT), as illustrated in FIG. 2, including: a gate electrode 1; a gate insulating layer 2 disposed on the gate electrode 1; a first active layer 3 disposed on the gate insulating layer 2; a second active layer 4 disposed on the first active layer 3, having a length smaller than that of the first active layer 3; a source electrode 5 disposed on the first active layer 3, being contacted with a first side of the second active layer 4; and a drain electrode 6 disposed on the first active layer 3, being contacted with a second side of the second active layer 4. Optionally, a passivation layer 7 can be disposed on the source electrode 5 and the drain electrode 6.

Figure 3:
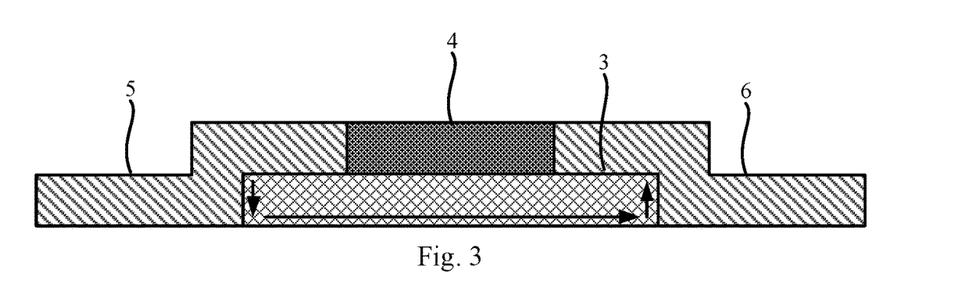
FIG. 3 is a schematic view illustrating a current direction in an active layer of the TFT provided by the embodiment of the present invention.

According to the above embodiment, as illustrated in FIG. 3, when conducted, a bottom side of the first active layer 3 serves as the conductive bottom, thus the two side walls of the first active layer 3 connected with the bottom side contribute the most to the variation of ON-resistance. In such case, given that a total thickness of the active layer is constant, that is, a sum of a thickness of the first active layer 3 and a thickness of the second active layer 4 provided in the present embodiment is equal to a thickness of an existing, single-layered active layer, the thickness of the first active layer 3 in the present embodiment will certainly be smaller than the thickness of the existing active layer, which means a height of the two side walls of the first active layer 3 that contribute the most to the ON-resistance will be smaller than that in the existing active layer. Consequently, as compared with the existing active layer, the two side walls directly contacted with the conductive bottom have smaller resistance, which can increase the ON-state current of the TFT.

Furthermore, still referring to FIG. 3, the second active layer 4 is disposed on the first active layer 3 and hence, more or less, can function to block light incident on the first active layer from above, thereby reducing an influence on the first active layer from the light.

In an example, the first active layer 3 has a resistivity smaller resistivity than that of the second active layer 4; that is, reducing a resistance of a channel region (i.e., the first active layer 3) between the source electrode 5 and the drain electrode 6. In this way, a resistance between the source electrode 5 and the drain electrode 6 in an ON-state circuit can be further reduced, and hence the ON-state current can be increased. Moreover, when not conducted, a leakage current in the TFT flows from the drain electrode 6 to the source electrode 5 through the second active layer 4, thus a larger resistance (e.g., $10^5 \Omega$) configured for the second active layer 4 in the present embodiment can reduce the OFF leakage current.

In an example, a material of both the first active layer 3 and the second active layer 4 is indium gallium zinc oxide (IGZO). IGZO has a carrier mobility usually 20-30 times of that of traditional materials for channel region (for example, amorphous silicon), which can considerably increase the charging and discharging rate of the TFT, and hence improve the response rate, refresh rate and also line scanning rate of pixels.

In an example, a content of indium in the second active layer 4 is smaller than that in the first active layer 3. Among three elements of indium, gallium and zinc in the IGZO, indium has the largest S-orbital radius, thus $In^{3+}$ influences a transport property of electrons much more than $Ga^{3+}$ and $Zn^{3+}$. As a result, configuring the second active layer 4 to have a smaller content of indium can provide the second active layer 4 with larger resistivity as compared with the first active layer 3, so as to ensure a lower resistance of the channel region (the first active layer 3).

In an example, a perpendicular bisector of the second active layer 4 is coincident with that of the first active layer 3. For example, the second active layer 4 is located right at a center of the first active layer so that an area of the source electrode 5 and an area of the drain electrode 6 that are contacted with the first active layer 3 respectively can be equal to each other, which ensures the first active layer 3 acts on the source electrode 5 and the drain electrode 6 equivalently, thereby achieving excellent switching characteristic of the TFT.

Figure 4:
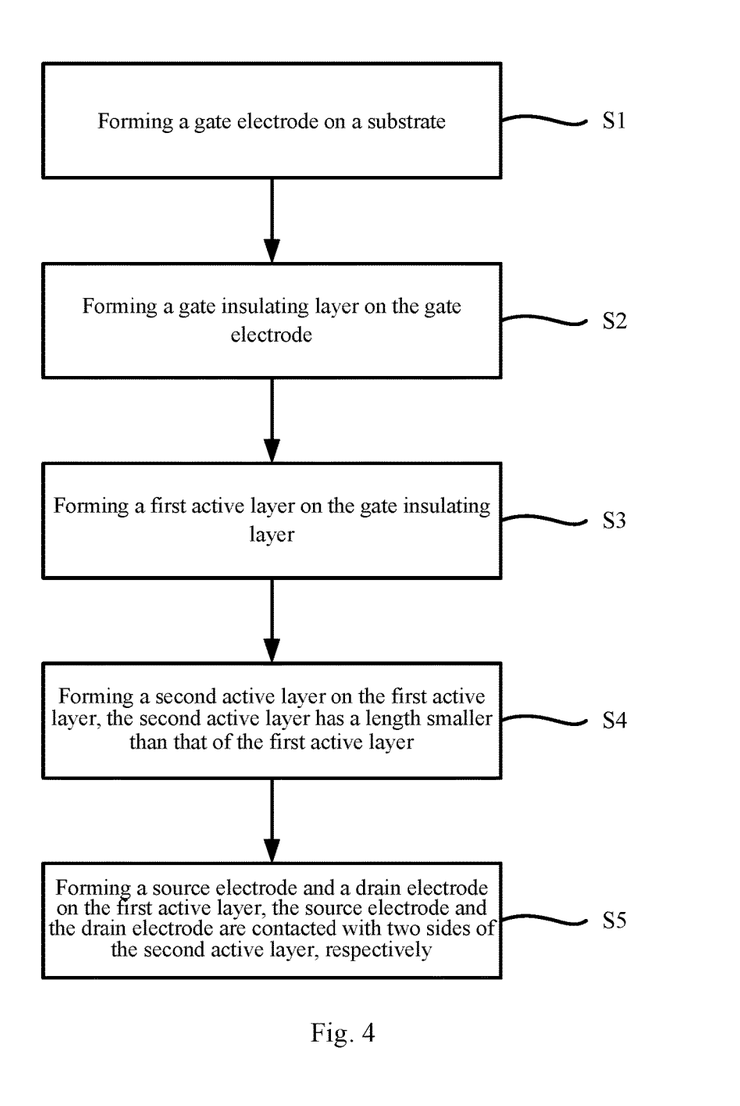
FIG. 4 is a flow chart illustrating a manufacturing method of a TFT provided by an embodiment of the present invention.
Figure 5:
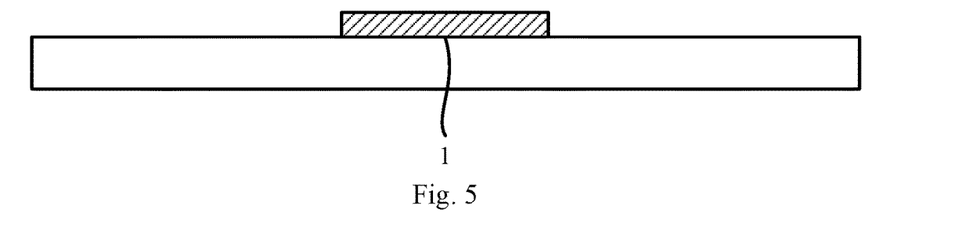
FIGS. 5-15 are schematic views illustrating various steps in the manufacturing method of the TFT provided by the embodiment of the present invention.
Figure 6:
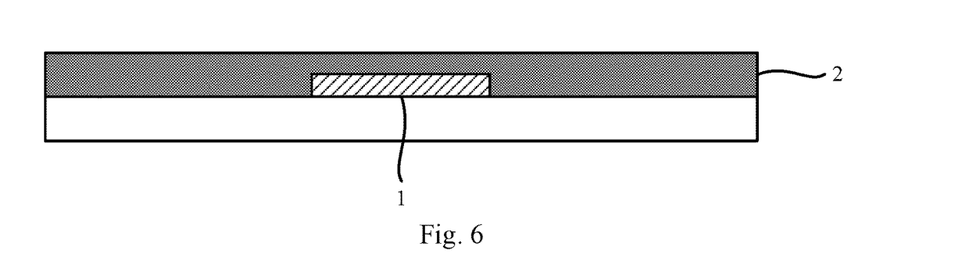
Figure 13:
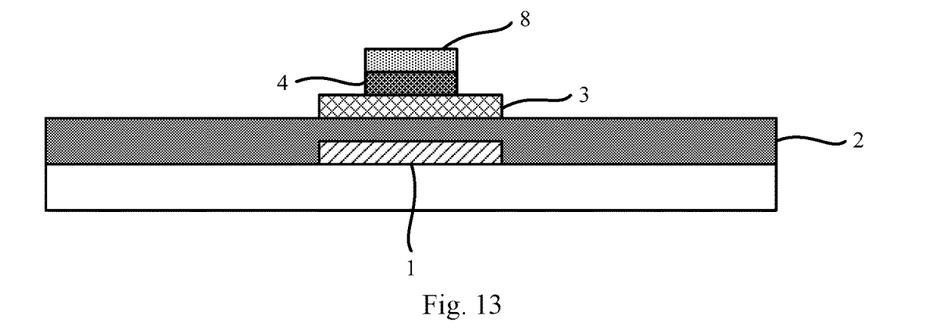
Figure 14:
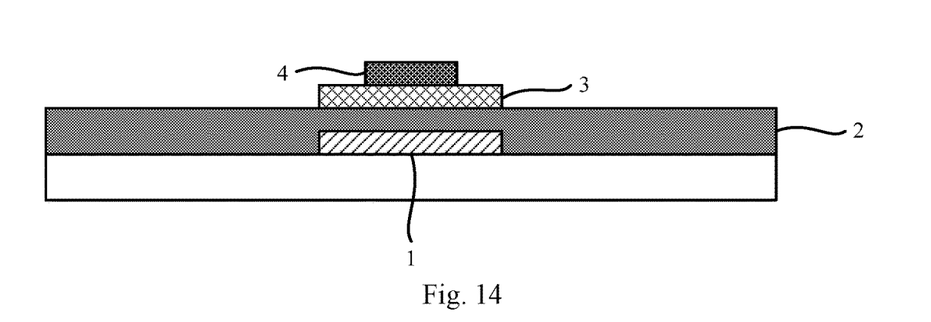
Figure 15:
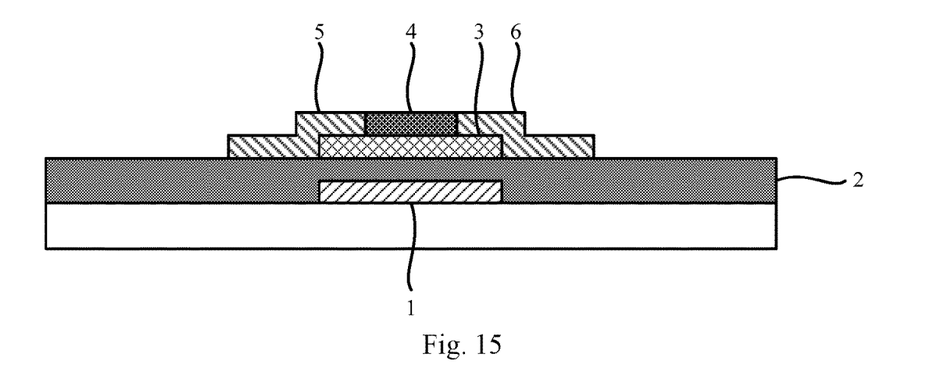

As illustrated in FIG. 4, the embodiment of the present invention further provides a manufacturing method of TFT, including steps of:

S1, forming a gate electrode 1 on a substrate, as illustrated in FIG. 5;

S2, forming a gate insulating layer 2 on the gate electrode 1, as illustrated in FIG. 6;

S3, forming a first active layer 3 on the gate insulating layer 2;

S4, forming a second active layer 4 on the first active layer 3, wherein the second active layer 4 has a length smaller than that of the first active layer 3, as illustrated in FIGS. 7-14; and S5, forming a source electrode 5 and a drain electrode 6 on the first active layer 3, wherein the source electrode 5 and the drain electrode 6 are contacted with two sides of the second active layer 4, respectively, as illustrated in FIG. 15.

Figure 7:
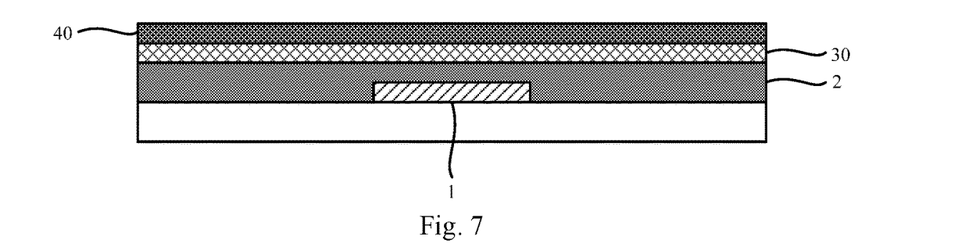
Figure 8:
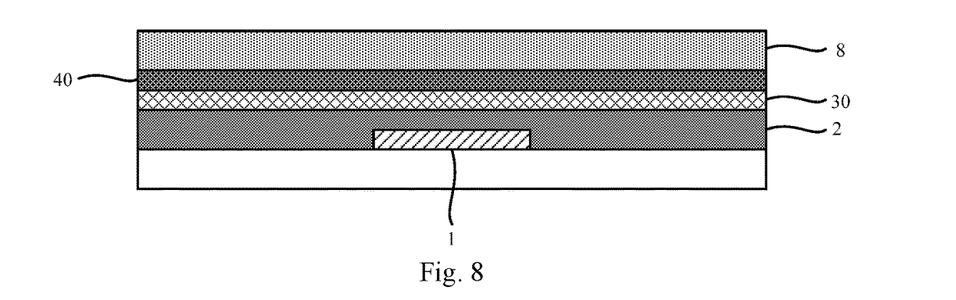
Figure 9:
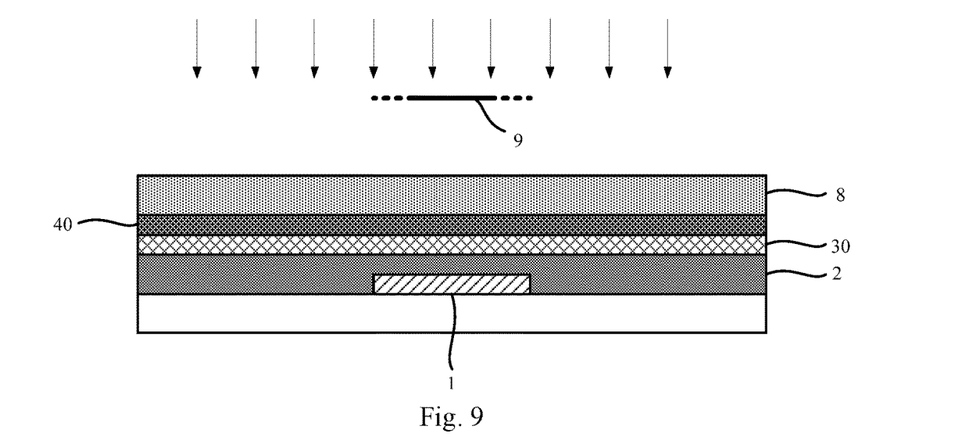
Figure 10:
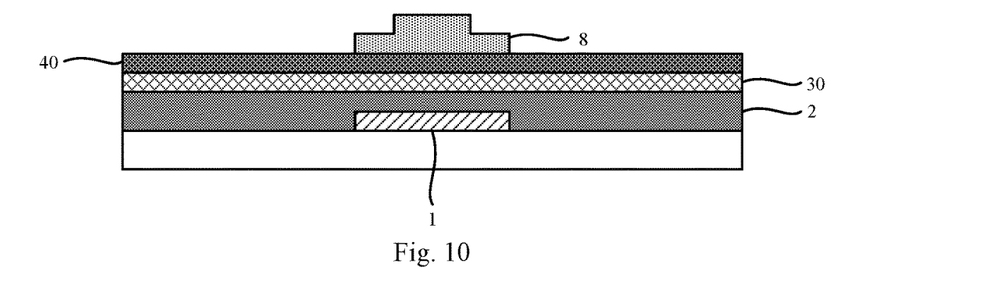
Figure 11:
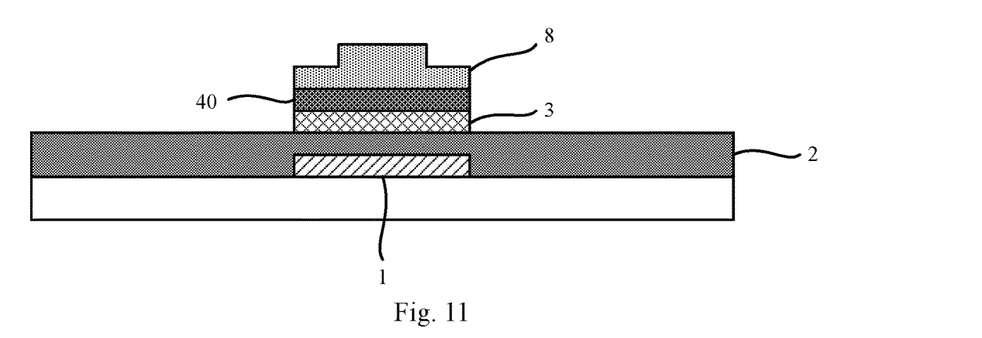
Figure 12:
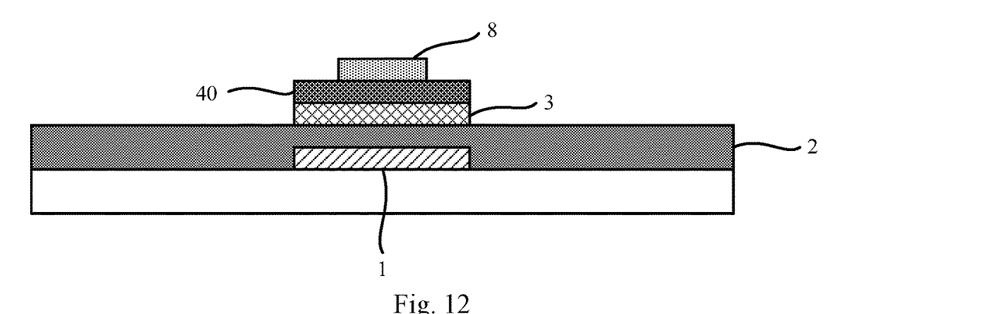

In an example, forming the first active layer 3 and the second active layer 4 includes:

forming a first semiconductor material layer 30 on the gate insulating layer 2;

forming a second semiconductor material layer 40 on the first semiconductor material layer 30, as illustrated in FIG. 7;

forming a photoresist 8 on the second semiconductor material layer 40, as illustrated in FIG. 8;

etching the photoresist 8 by using a halftone mask 9 to completely remove a portion of the photoresist 8 in a first region, to partly remove a portion of the photoresist 8 in a second region and to preserve a portion of the photoresist 8 in a third region, as illustrated in FIG. 9 and FIG. 10;

etching away a portion of the first semiconductor material layer 30 in the first region and a portion of the second semiconductor material layer 40 in the first region so that a remaining portion of the first semiconductor material layer 30 is the first active layer 3, as illustrated in FIG. 11;

etching away a remaining portion of the photoresist 8 in the second region, as illustrated in FIG. 12;

etching away a portion of the second semiconductor material layer 40 in the second region so that a remaining portion of the second semiconductor material layer 40 is the second active layer 4, as illustrated in FIG. 13, then peeling off a remaining portion of the photoresist 8 to form the first active layer 3 and the second active layer 4, as illustrated in FIG. 14.

As above, by utilizing a half-tone masking process, the first active layer 3 and the second active layer 4 having different lengths can be conveniently prepared.

In an example, forming the first semiconductor material layer 30 and the second semiconductor material layer 40 includes:

sputtering a target of indium gallium zinc oxide (IGZO) to form the first semiconductor material layer 30 and the second semiconductor material layer 40.

In an example, forming the first semiconductor material layer 30 includes: sputtering a target of indium gallium zinc oxide (IGZO) on the gate insulating layer 2 at a first power; and forming the second semiconductor material layer 40 includes: sputtering a target of indium gallium zinc oxide (IGZO) on the first semiconductor material layer 30 at a second power, wherein the second power is larger than the first power.

Given that a content of indium in IGZO target is kept constant, the content of indium in the IGZO layer as formed is varied depending on the power at which the sputtering process is performed. Of course, alternatively, two active layers with different contents of indium can also be achieved by preparing various IGZO targets with different contents of indium in advance and then sputtering the targets at a same power to form the first semiconductor material layer 30 and the second semiconductor material layer 40.

The forming process utilized in the above flow may include patterning process and film forming process such as depositing and sputtering.

Based on the same inventive concept, the embodiment of the present invention further provides a display substrate including the foregoing TFT.

Based on the same inventive concept, the embodiment of the present invention further provides a display device including the foregoing display substrate.

It's noted that the display device provided by the embodiment of the present invention may be implemented as digital paper, mobile phone, tablet computer, TV set, notebook computer, digital photo frame, navigator or any other products or components having display function.

The foregoing are merely specific embodiments of the invention, but not limitative to the protection scope of the present disclosure. Therefore, the protection scope of the invention should be defined by the accompanying claims.

The present application claims the priority of the Chinese patent application No. 201610019045.2 filed on Jan. 12, 2016, the entirety of which is incorporated herein by reference as a part of the present application.

What is claimed is:

1. A thin film transistor (TFT), comprising:
   a gate electrode;
   a gate insulating layer disposed on the gate electrode;
   an active layer having a double-layered structure comprising a first active layer disposed directly on the gate insulating layer and a second active layer disposed directly on the first active layer, the second active layer having a length smaller than that of the first active layer, the first active layer comprising a top surface and a bottom surface, the top surface and the bottom surface being parallel to each other, and a first portion of of the top surface being directly in contact with the second active layer;
   a source electrode disposed on the first active layer, being partly directly in contact with a second portion of the top surface of the first active layer and partly in contact with a first side surface of the second active layer; and
   a drain electrode disposed on the first active layer, being partly directly in contact with a third portion of the top surface of the first active layer and partly in contact with a second side surface of the second active layer, wherein
   a resistivity of the first active layer is smaller than that of the second active layer, and
   the first portion, the second portion, and the third portion of the top surface of the first active layer are continuously and integrally formed to have an equal height everywhere along the top surface.

2. The TFT according to claim 1, wherein a material of both the first active layer and the second active layer is indium gallium zinc oxide (IGZO).

3. The TFT according to claim 2, wherein a content of indium in the second active layer is smaller than that in the first active layer.

4. The TFT according to claim 1, wherein a perpendicular bisector of the second active layer is coincident with that of the first active layer.

5. The TFT according to claim 2, wherein a perpendicular bisector of the second active layer is coincident with that of the first active layer.

6. The TFT according to claim 3, wherein a perpendicular bisector of the second active layer is coincident with that of the first active layer.

7. A display substrate, comprising the thin film transistor according to claim 1.

8. A manufacturing method of TFT, comprising:
   forming a gate electrode on a substrate;
   forming a gate insulating layer on the gate electrode;
   forming an active layer having a double-layered structure, by directly forming a first active layer on the gate insulating layer and directly forming a second active layer on the first active layer, the second active layer having a length smaller than that of the first active layer, the first active layer comprising a top surface and a bottom surface, the top surface and the bottom surface being parallel to each other, and a first portion of the top surface being directly in contact with the second active layer; and
   forming a source electrode and a drain electrode on the top surface of the first active layer, the source electrode and the drain electrode being partly directly in contact with a second portion and a third portion of the top surface of the first active layer, respectively, and the source electrode and the drain electrode being partly in contact with two opposing sides of the second active layer, respectively, wherein
   a resistivity of the first active layer is smaller than that of the second active layer, and
   the first portion, the second portion, and the third portion of the top surface of the first active layer are continuously and integrally formed to have an equal height everywhere along the top surface.

9. The manufacturing method of claim 8, wherein forming the first active layer and the second active layer comprises:
   forming a first semiconductor material layer on the gate insulating layer;
   forming a second semiconductor material layer on the first semiconductor material layer;
   forming a photoresist on the second semiconductor material layer;
   etching the photoresist by using a halftone mask to completely remove a portion of the photoresist in a first region, partly remove a portion of the photoresist in a second region, and preserve a portion of the photoresist in a third region;
   etching away a portion of the first semiconductor material layer in the first region and a portion of the second semiconductor material layer in the first region so that a remaining portion of the first semiconductor material layer is the first active layer;
   etching away a remaining portion of the photoresist in the second region; and etching away a portion of the second semiconductor material layer in the second region so that a remaining portion of the second semiconductor material layer is the second active layer.

10. The manufacturing method of claim 9, wherein forming the first semiconductor material layer and the second semiconductor material layer comprises:

sputtering a first target of indium gallium zinc oxide (IGZO) to form the first semiconductor material layer; and sputtering a second target of indium gallium zinc oxide (IGZO) to form the second semiconductor material layer.

11. The manufacturing method of claim 10, wherein forming the first semiconductor material layer comprises sputtering the first target of indium gallium zinc oxide (IGZO) on the gate insulating layer at a first power, wherein forming the second semiconductor material layer comprises sputtering the second target of indium gallium zinc oxide (IGZO) on the first semiconductor material layer at a second power, and wherein the first target and the second target have a same content of indium, and the second power is larger than the first power.

* * * * *